(12) United States Patent
Rosenberger

(10) Patent No.: US 6,483,182 B2
(45) Date of Patent: Nov. 19, 2002

(54) INTEGRATED-CIRCUIT CASE

(75) Inventor: Bernd Rosenberger, Fridolfing (DE)

(73) Assignee: Rosenberger Hochfrequenztechnik GmbH & Co. KG (DE)

( * ) Notice: Subject to any disclaimer, the term of this patent is extended or adjusted under 35 U.S.C. 154(b) by 0 days.

(21) Appl. No.: 09/907,453

(22) Filed: Jul. 18, 2001

(65) Prior Publication Data

US 2002/0030265 A1 Mar. 14, 2002

(30) Foreign Application Priority Data

Jul. 18, 2000 (DE) .................... 200 12 450 U

(51) Int. Cl.⁷ .................... H01L 23/48; H01L 23/02
(52) U.S. Cl. .................... 257/693; 257/692; 257/784; 257/690; 257/694; 257/728; 257/735
(58) Field of Search .................... 257/678, 690, 257/692, 693, 694, 697, 728, 735, 784, 786; 174/117 F; 343/700 MS; 333/172, 33; 216/14; 379/412

(56) References Cited

U.S. PATENT DOCUMENTS

| | | | |
|---|---|---|---|
| 4,992,851 A | 2/1991 | Platzoeder et al. | 357/74 |
| 5,736,783 A | 4/1998 | Wein et al. | 257/691 |
| 5,977,631 A | 11/1999 | Notani | 257/728 |
| 6,046,501 A | 4/2000 | Ishikawa et al. | 257/730 |
| 6,075,427 A * | 6/2000 | Tai et al. | 257/728 |
| 6,162,653 A * | 12/2000 | Maund | 257/728 |
| 6,205,031 B1 * | 3/2001 | Herzog et al. | 174/117 F |

FOREIGN PATENT DOCUMENTS

| | | |
|---|---|---|
| DE | 4330108 A1 | 3/1994 |
| DE | 19531975 A1 | 3/1996 |
| DE | 19721141 A1 | 11/1997 |
| DE | 19842800 A1 | 7/1999 |
| DE | 19927258 A1 | 11/2001 |

* cited by examiner

*Primary Examiner*—Minh Loan Tran
*Assistant Examiner*—Tan Tran
(74) *Attorney, Agent, or Firm*—Lowe Hauptman Gilman & Berner, LLP

(57) ABSTRACT

A case for an integrated-circuit mounted on a substrate provides electrical conducting contacts between the integrated circuit and contact elements on an external circuit, e.g., a printed circuit, connected to the case. The case includes contact pins and planar contact leads have free ends that are electrically connected by pressure, without bonding, to corresponding contact areas on the substrate. The substrate carries leads connecting the substrate contact areas with the integrated circuit contacts. At least some of the planar contact leads are configured as a lead structure having a predetermined impedance.

20 Claims, 2 Drawing Sheets

INTEGRATED-CIRCUIT CASE

FIELD OF INVENTION

The present invention relates generally to integrated-circuit cases and more particularly to a case for carrying a substrate carrying an integrated circuit, wherein the substrate is fitted with contact areas suitable to provide electrical conducting connections between the integrated circuit and contact elements mounted on the case.

BACKGROUND ART

Contact connections between contact areas of a substrate and pins mounted outside an integrated circuit case for contacting the circuit on a printed-circuit board are conventionally implemented by bonding. Such a procedure however is complex and costly. Also such bonded contacts, when used for high frequency integrated circuits, can result in unpredictable high-frequency characteristics that can result in heat dissipation losses.

An object of the present invention is to provide a new and improved case of the above discussed type which provides a simpler contact arrangement and improved high-frequency signal coupling.

SUMMARY OF THE INVENTION

According to the present invention, an integrated circuit case for carrying an integrated circuit which is mounted on a substrate includes contact areas to establish electrical conducting contact with the integrated circuit. The case comprises contact elements for electrical connections to the contact areas. The contact areas are electrically connected to corresponding contact elements of the integrated circuit. The case includes an array of contact leads electrically connected to the case contact elements. The case contact elements are arranged to spatially coincide with the array of contact areas in such manner that free ends of the contact leads are arranged to contact the substrate contact areas. At least some of the contact leads have a coplanar lead structure of predetermined impedance.

Such a configuration offers the advantage that the impedance-controlled contact elements between the substrate and the case reduce power losses caused, for instance, by high frequency energy reflection at impedance discontinuities. Accordingly, there is a reduction in heat dissipation, i.e., less "thermal stressing" is attained. Thereby, integrated circuits operating at high clock rates, such as computer processors (CPUs), can be packaged into the case in a problem-free manner. The case is designed so conventional integrated circuits can be packaged in the case, enabling the case to be easily integrated in existing production facilities without causing problems.

Simple and economical installation of the integrated circuit into the case is attained by designing the case contact leads to be intrinsically dimensionally stable and flexible and by mounting them in such a way that, when the integrated circuit is mounted inside the case, the case contact leads contact corresponding contact areas of the substrate with appropriate contact pressures in order to establish the desired electrical contact. In using the case of the present invention, there is no need to establish each contact individually, in contrast to the prior art use of boned wires.

Optimal impedance matching, possibly with simultaneous impedance conversion, between the substrate contact areas and the contact elements on the case, is attained because the impedance of the coplanar contact leads at one end of an output impedance facing the substrate contact areas corresponds to the output impedance at the particular substrate contact areas with which contact is made. In addition, the impedance of the coplanar contact leads at one end facing the case contact elements corresponds to a printed-circuit board input impedance at the corresponding contact areas.

At least some of the case contact elements are preferably pins to affix a surface of the case to a printed circuit external to the case.

In a preferred embodiment of the invention, a dielectric slab supporting the coplanar lead structure is affixed to at least one coplanar lead structure across a predetermined segment between a free end of the contact element and the case contact elements on one or both sides of the case. The individual leads of the coplanar lead structure are configured between the dielectric and the contact element free end in such manner that the leads are supported in a resilient manner in the space or relative to the affixing dielectric.

A gap is subtended for the purpose of controlled impedance matching in such manner between two leads of at least one coplanar lead structure. This causes a predetermined wave impedance, which is constant or variable, to be provided between the contact element free end and the case contact elements. If a dielectric is used, the gap where the dielectric is located is commensurately wider than in the region where the coplanar lead structure does not have a dielectric.

In order to attain optimally screened and impedance-controlled contacting, the case contact elements are at least partly in the form of coaxial connectors to provide connection to a coaxial cable.

In an especially preferred embodiment of the invention, the coaxial connector is an angled connecting element which, at the case, electrically connects a particular coplanar lead structure to a coaxial waveguide. Such a coaxial connector comprises: (1) an adapter at the side of the coplanar structure to connect to a planar strip and (2) a coaxial adapter at the side of the coaxial array which can be connected to a coaxial line. The adapter on the coplanar structure side is connected within the outer circumference of the angled connecting element to an inner pin of the coaxial connector. The adapter at the coplanar structure side can also be in the form of a planar waveguide having a predetermined wave impedance. The adapter at the coplanar structure side is fitted with a dielectric substrate and a stripline. The inner pin of the coaxial connector is connected through the substrate to the stripline within a housing of the angled connecting element.

The substrate is preferably made of polytetrafluroethylene and the planar waveguide is preferably a microstrip line or a coplanar line. A screw or clamp fitting is appropriately present at the coaxial connector for fixedly mounting a coaxial line. Preferably the planar waveguide is mounted perpendicularly to the coaxial connector.

At least several of the contact areas are configured at least partly as a coplanar structure of leads to attain low transmission losses of high frequency signals coupled between the integrated circuit and the case contact elements.

The above and still further objects, features and advantages of the present invention will become apparent upon consideration of the following detailed descriptions of several specific embodiments thereof, especially when taken in conjunction with the accompanying drawings.

DETAILED DESCRIPTION OF THE DRAWING

Figure 1:
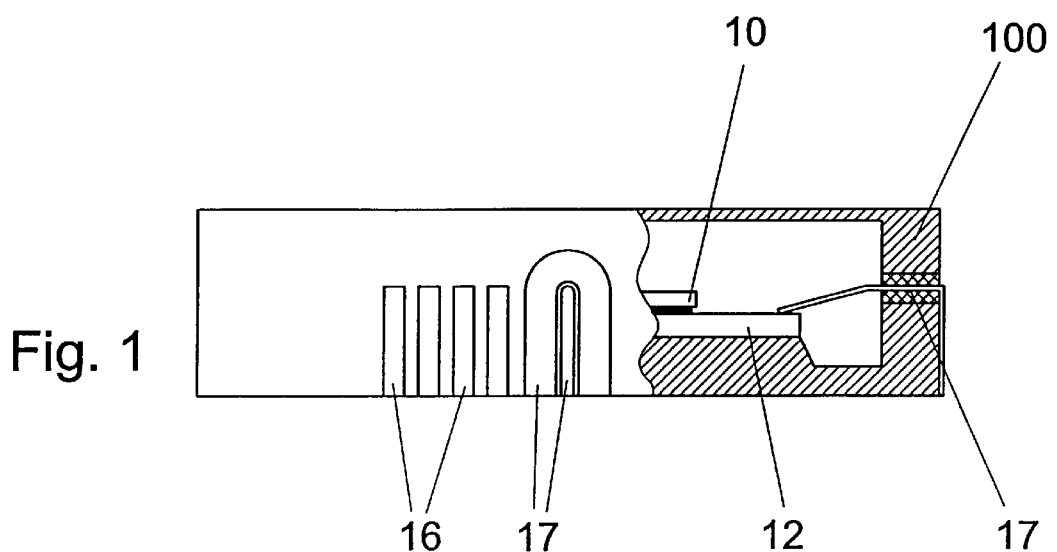
FIG. 1 is a side view of a first embodiment of a case according to a preferred embodiment of the invention, wherein the case carries an integrated circuit (IC) that is shown schematically and in a partly cutaway side view.
Figure 2:
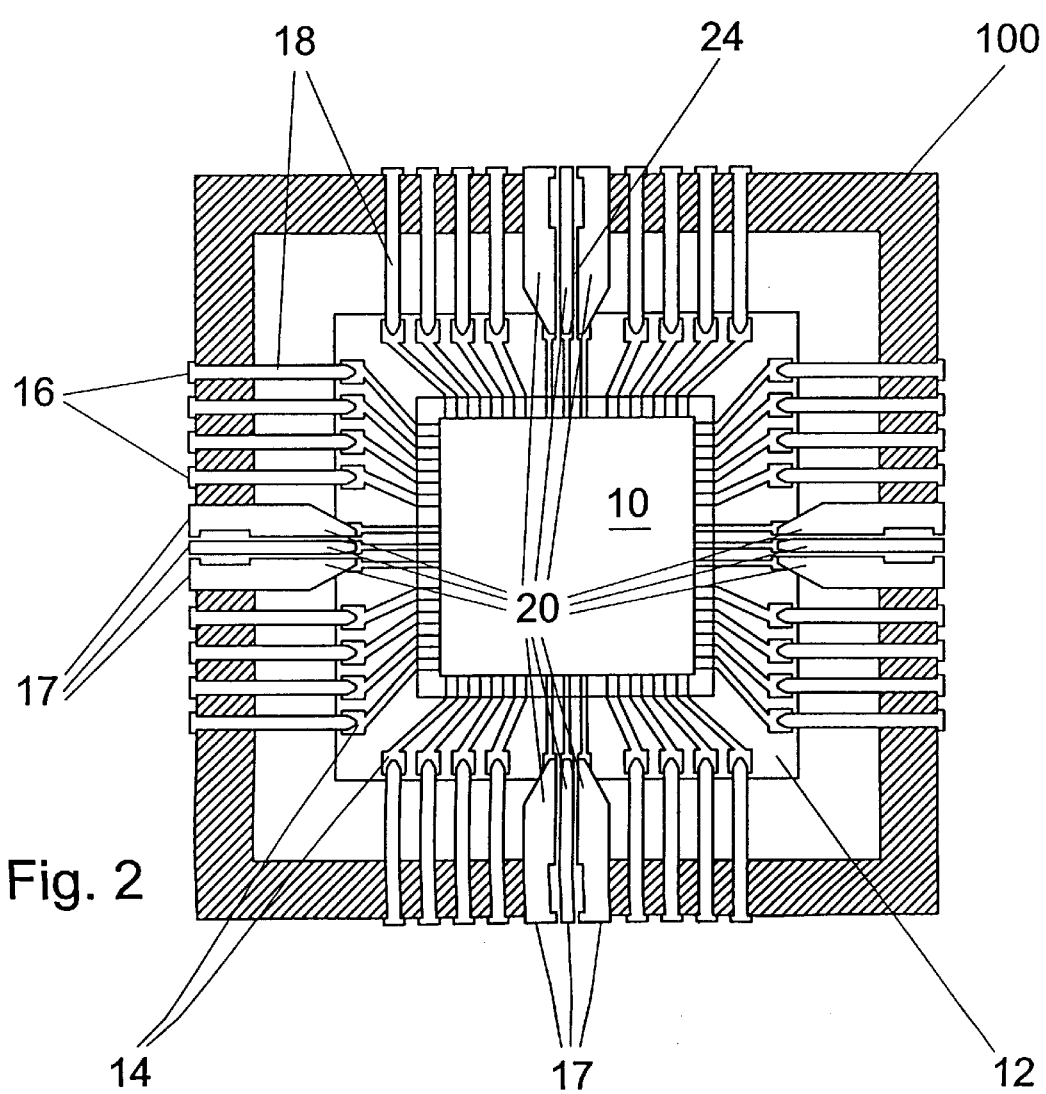
FIG. 2 is a schematic topview of the structure illustrated in FIG. 1.

The first preferred embodiment shown in FIGS. 1 and 2 includes a case 100 that carries integrated circuit 10, in turn mounted on substrate 12 which includes contact areas 14 electrically connected to integrated circuit 10. Case 100 also carries elements 16, 17 which, externally to case 100, make contact with a circuit of a printed circuit board (not shown). Contact elements 16, 17 make electrical contact inside case 100 with contact areas 14 on the substrate 12.

Contact leads 18,20 provide electrical contact between contact areas 14 on substrate 12 and contact elements 16, 17 on case 100. Contact leads 18, 20 as a whole constitute a contact-lead structure, i.e., array. This contact-lead array is configured in such a way that, when substrate 12 is present in case 100, the particular free ends of contact leads 18, 20, i.e., the ends of the leads that are not carried by case 100, engage corresponding sites of contact areas 14 on substrate 12. Contact leads 18, 20 have appropriate intrinsic mechanical strength and resilience so that when integrated circuit 10 is installed in case 100 appropriate electrical contacts are provided between contact leads 18, 20 and contact areas 14 on substrate 12, without bonding. In particular, the free ends of contact leads 18, 20 apply a commensurate pressure to contact areas 14. For that purpose, contact leads 18, 20 are designed to intrinsically have appropriate mechanical strength and spring properties.

Whereas contact leads 18 within case 100 are designed like pins, contact leads 20 are coplanar and designed to have a predetermined electrical impedance. Consequently, an impedance match is provided for signal transmission from contact areas 14 on substrate 12 through contact leads 20 to contact elements 17 that extend externally on the case. Contact elements 17 external to case 100 are designed as a coplanar lead structure having a predetermined impedance. Consequently signal transmission from contact areas 14 on substrate 12 through contact leads 20 to contact elements 17 external to the case have a predetermined impedance. For that purpose, contact elements 17 mounted on the outside of case 100 are designed to contact a corresponding coplanar lead structure on a printed circuit board (not shown). In the embodiment of case 100 shown in FIGS. 1 and 2, contact element 17 is a planar, impedance controlled surface mounted terminal, that is considered a contact element.

Figure 3:
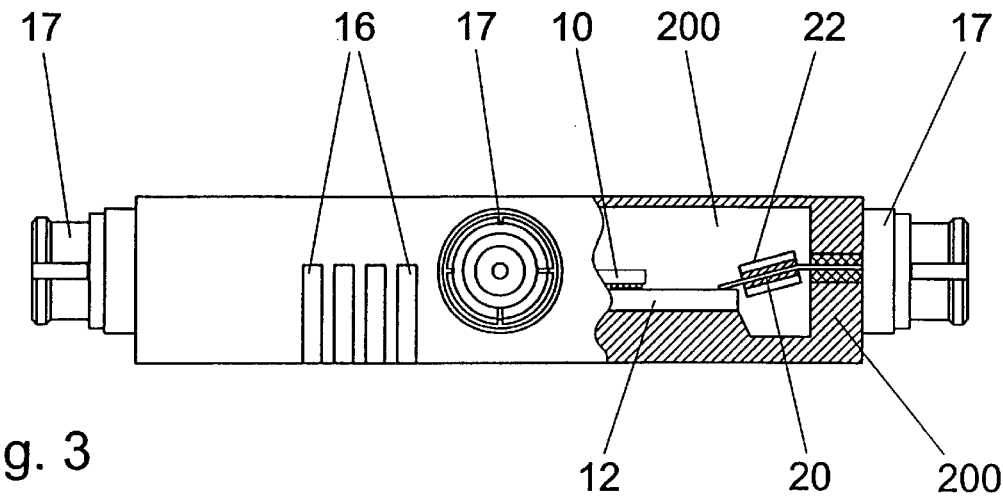
FIG. 3 is a side view of a second preferred embodiment of a case carrying an IC, that is in a partly cutaway sideview.
Figure 4:
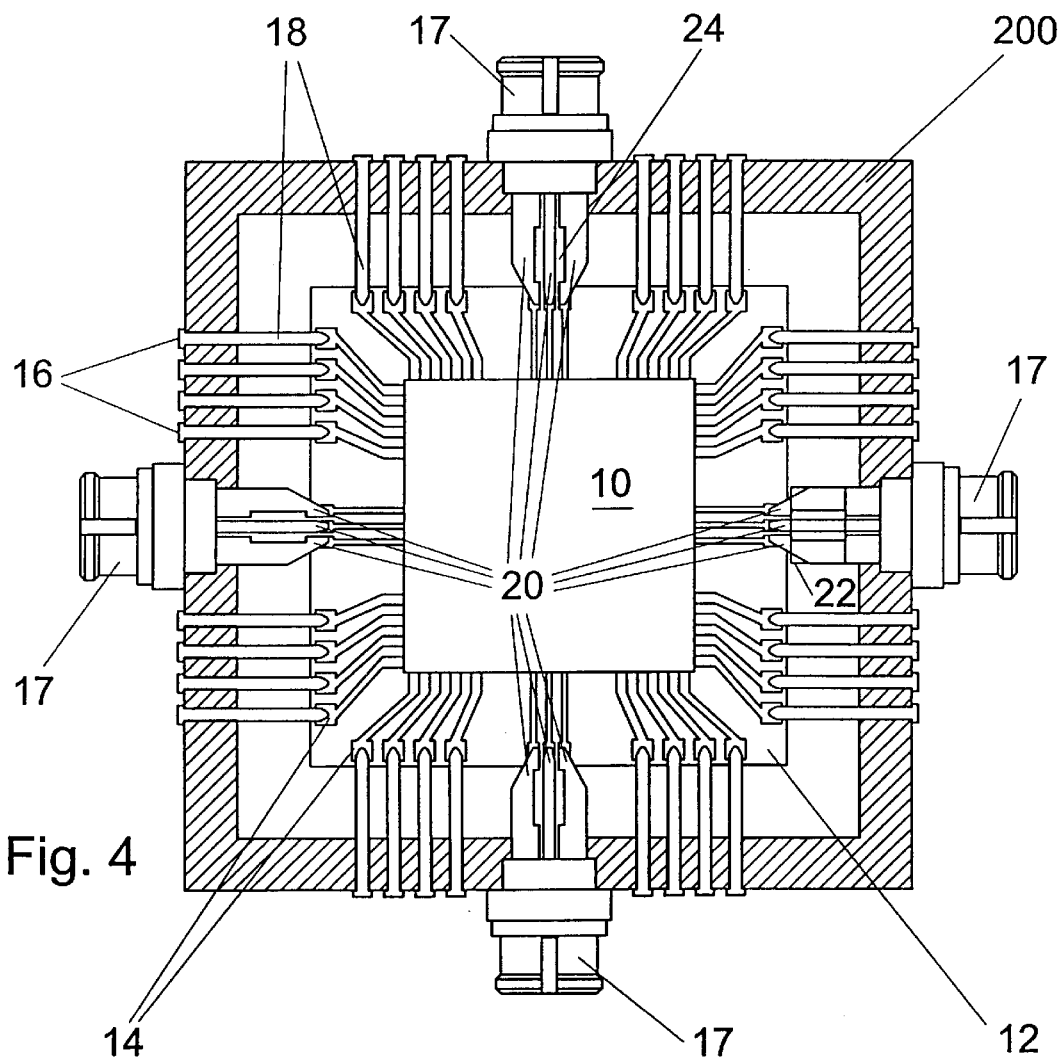
FIG. 4 is a schematic topview of the structure illustrated in FIG. 3.

The second preferred embodiment shown in FIGS. 3 and 4 includes case 200 and other elements which are the same as corresponding elements of FIG. 1; the corresponding elements are denoted by the same reference numerals as in FIGS. 1 and 2. The above description of case 100 should suffice for many purposes with regard to the description of case 200. Contrary to case 100, the contact elements 17 associated with the coplanar contact leads 20 are designed in the second embodiment of FIGS. 3 and 4 as coaxial connectors 17 for connection with a coaxial cable. Furthermore a coplanar lead structure subtended by three contact leads 20 is carried by dielectric layer 22.

Both embodiments of the invention assure low-loss, impedance-controlled transmission of high frequency signals through contact leads 20 and contact elements 17 that extend out of case 100 or 200 to an external circuit. As a result and in an illustrative manner, such a design precludes thermally stressing the integrated circuit 10 within case 100 or 200. Vice-versa, at constant thermal stress, integrated circuit 10 can be operated at a higher clock rate.

Three contact leads 20 at a time constitute a coplanar lead structure, a gap 24 being subtended in such a way that a predetermined, constant wave impedance, or a wave impedance varying in predetermined manner, is present between the free contact element ends and the contact elements 17 in either case 100 or 200. The middle contact of each lead 20 of the coplanar structure is a signal lead. The two external contacts of each lead 20 are grounded.

While there have been described and illustrated specific embodiments of the invention, it will be clear that variations in the details of the embodiments specifically illustrated and described may be made without departing from the true spirit and scope of the invention as defined in the appended claims.

What is claimed is:

1. A case for an integrated circuit which is mounted on a substrate adapted to be located in the case, the substrate including contact areas to establish electrical conducting contact with the integrated circuit, the case comprising contact elements for electrical connection to the contact areas, the contact areas being electrically connected to corresponding contact elements of the integrated circuit, the case including an array of contact leads electrically connected to the case contact elements, the case contact elements being arranged to spatially coincide with the array of contact areas in such manner that free ends of contact leads are arranged to contact the substrate contact areas, at least some of the contact leads having a coplanar lead structure of predetermined electric impedance, a dielectric affixed to the coplanar lead structure mounted on at least one such coplanar lead structure across a predetermined segment between the free contact element end and the case contact elements at least on one side, the individual coplanar leads of the coplanar lead structure being situated between the dielectric and the free contact end so as to be free in the space and resilient relative to the supporting dielectric.

2. The case a claimed in claim 1, wherein the contact leads are planar.

3. The case as claimed in claim 1, wherein the contact leads are resilient and intrinsically dimensionally stable and are configured in such manner that, in the presence of the integrated circuit in the case, the contact leads contact with appropriate pressures the corresponding contact areas of the substrate to provide the particular electrical connection.

4. The case as claimed in claim 1, wherein the coplanar contact leads are arranged in such a manner that their impedance at an end facing the contact areas of the subtract corresponds to an output impedance at the contact areas on the subtract with which contact is to be made.

5. The case as claimed in claim 1, wherein the coplanar contact leads are arranged so that their impedance at an end facing the case contacts corresponds to an input impedance of a printed circuit board at the corresponding contact sites.

6. The case as claimed in claim 1, wherein the integrated circuit is a semiconductor chip.

7. The case as claimed in claim 1, wherein the integrated circuit is a central processing unit (CPU).

8. The case as claimed in claim 1, wherein at least some of the contact elements are pins for surface-affixing the case on a printed circuit board.

9. The case as claimed in claim 1, wherein a gap is subtended between two leads of at least one coplanar lead structure extending from the free contact element end to the case contact elements to establish a predetermined, constant wave impedence or a predetermined variable wave impedence between the free contact element and the case contact elements.

10. The case as claimed in claim 9, wherein the particular gap is wider where it overlaps the dielectric than where it does not overlap the dielectric.

11. The case as claimed in claim 9, wherein the dielectric includes at least one block of quartz.

12. The case as claimed in claim 9, wherein the dielectric includes, at a connection side to the coplanar lead structure, a metal layer substantially congruent with the lead structure.

13. The case as claimed in claim 9, wherein the dielectric is metallized over its entire surface on a side away from the coplanar lead structure.

14. The case as claimed in claim 1, wherein at least some of the contact areas on the substrate are configured at least in part as a coplanar lead structure.

15. A case for an integrated circuit mounted on a substrate adapted to be located in the case, the substrate including contact areas to establish electrical conducting contact with the integrated circuit, the case comprising contact elements for electrical connection to the contact areas, the contact areas being electrically connected to corresponding contact elements of the integrated circuit, the case including an array of contact leads electrically connected to the case contact elements, the case contact elements being arranged to spatially coincide with the array of contact areas in such manner that free ends of contact leads are arranged to contact the substrate contact areas, at least some of the contact leads having a coplanar lead structure of predetermined electric impedance, wherein at least some of contact elements are designed coaxial connectors for connection to a coaxial cable, the coaxial connector including (a) an angled connector element fitted with a coaxial wave guide for electrically connecting a particular coplanar lead structure on a side of the case, (b) an adapter at a side of the coplanar structure for connection to a planar printed circuit board, and (c) a coaxial connector on the side of the coaxial structure, said coaxial connector being connectable to a coaxial line; the adapter at the side of the coplanar structure being (a) connected within the outer periphery of the angled connecting element to an inner conducting pin of the coaxial connector, (b) configured as a planar wave guide having a defined wave impedance, and (c) carrying a dielectric substrate and a stripline; the inner conducting pin of the coaxial adapter being connected to said stripline within a housing of the angled connection element while passing through the substrate.

16. The case as claimed in claim 15, wherein the subtracts consists essentially of polytetrafluoroethylene.

17. The case as claimed in claim 15, wherein the planar waveguide is formed as a microstrip or a coplanar line.

18. The case as claimed in claim 15, further including a screw or clamp fitting for fixedly mounting a coaxial line, the screw or clamp fitting being mounted on the coaxial adapter.

19. The case as claimed in claim 15, wherein the planar waveguide is positioned at a right angle relative to the coaxial adapter.

20. In combination, an integrated circuit mounted on a substrate, the integrated circuit being located in a case, the substrate including contact areas establishing electrical conducting contact with the integrated circuit, the case comprising contact elements electrically connected to the contact areas, the contact areas being electrically connected to corresponding contact elements of the integrated circuit, the case including an array of contact leads electrically connected to the case contact elements, the case contact elements being arranged to spatially coincide with the array of contact areas in such manner that free ends of contact leads are arranged to contact the substrate contact areas, at least some of the contact leads having a coplanar lead structure of predetermined electric impedance, a dielectric affixed to the coplanar lead structure mounted on at least one such coplanar lead structure across a predetermined segment between the free contact element end and the case contact elements at least on one side, the individual coplanar leads of the coplanar lead structure being situated between the dielectric and the free contact end so as to be free in the space and resilient relative to the supporting dielectric.

* * * * *